United States Patent [19]

Leipold et al.

[11] Patent Number: 4,875,131
[45] Date of Patent: Oct. 17, 1989

[54] CIRCUIT CONFIGURATION FOR MONITORING A SEMICONDUCTOR STRUCTURAL ELEMENT AND PROVIDING A SIGNAL WHEN THE TEMPERATURE EXCEEDS A PREDETERMINED LEVEL

[75] Inventors: Ludwig Leipold; Rainald Sander; Jenoe Tihanyi; Roland Weber, all of Munich, Fed. Rep. of Germany

[73] Assignee: Siemens Aktiengesellschaft, Berlin and Munich, Fed. Rep. of Germany

[21] Appl. No.: 342,835

[22] Filed: Apr. 25, 1989

[30] Foreign Application Priority Data

Aug. 11, 1988 [DE] Fed. Rep. of Germany ....... 3816259

[51] Int. Cl.$^4$ .............................................. H02H 5/04
[52] U.S. Cl. ..................................... 361/103; 357/28; 307/310; 374/178
[58] Field of Search ...................... 361/87, 93, 98, 101, 361/103; 357/28; 330/143; 307/310; 340/584, 588, 643; 374/178

[56] References Cited

U.S. PATENT DOCUMENTS

| | | | |
|---|---|---|---|
| 4,220,873 | 9/1980 | Giordano | 307/310 X |
| 4,355,344 | 10/1982 | Felici et al. | 361/103 |
| 4,652,144 | 3/1987 | Gunther | 357/28 X |
| 4,667,265 | 5/1987 | Stanojevic et al. | 361/103 |
| 4,730,228 | 3/1988 | Einzinger et al. | 361/103 |

Primary Examiner—Derek S. Jennings
Attorney, Agent, or Firm—James G. Morrow

[57] ABSTRACT

A circuit for monitoring the temperature of a semiconductor structural component. The circuit includes a bipolar transistor (1) in thermal contact with a semiconductor structural element to be monitored, and a MOSFET (11) connected in series with a current source (12). The MOSFET (11) is maintained in a nonconducting state with two Zener diodes (13, 14) if the bipolar transistor (1) is the standard operating temperature of the semiconductor structural element. This circuit provides for a reduced zero current signal. The current flowing through the bipolar transistor (1) increases with temperature and the gate-source voltage of the MOSFET (11) is increases until it switches off. If the current flowing through the MOSFET (11) is greater than the impressed current of the current source (12) the potential across the current source takes a step increase a value near the supply voltage ($V_{DD}$). This voltage step can then be detected as an excess-temperature signal.

6 Claims, 1 Drawing Sheet

CIRCUIT CONFIGURATION FOR MONITORING A SEMICONDUCTOR STRUCTURAL ELEMENT AND PROVIDING A SIGNAL WHEN THE TEMPERATURE EXCEEDS A PREDETERMINED LEVEL

BACKGROUND OF INVENTION

This invention relates to a circuit configuration for monitoring the temperature of the structural element for a semiconductor component such that temperatures exceeding a preset limit are detected.

FIG. 1 is a schematic illustration of a bipolar transistor 1 thermally coupled to the semiconductor structural element to be monitored. By way of example, the element could be a power MOSFET or a power IC.

The circuit includes a bipolar transistor 1 connected in series with a current source 2 such as an N-channel depletion transistor. A Zener diode 3 is connected in parallel with the bipolar transistor 1 to limit the collector-emitter voltage. A series connection of a MOSFET 4, a resistor 9 and a current source 5 is connected in parallel with the transistor 1 and current source 2. More specifically, the collector terminal C of the bipolar transistor 1 is connected to the source terminal S of the MOSFET 4, and the gate terminal G of MOSFET 4 is connected to the emitter terminal E of the bipolar transistor. A Zener diode 6 can be connected in parallel to the current source 5, which can also be implemented as an n-channel depletion transistor. The resistance 9 represents the ON state D.C. resistance of the MOSFET 4.

When an operating voltage $V_{DD}$ is applied between terminal 7 and ground, the current flowing through bipolar transistor 1 depends upon the temperature of the transistor 1. Accordingly, the current flowing through the bipolar transistor 1 also depends on the temperature of the semiconductor structural element since the transistor 1 and structural element are thermally coupled.

The bipolar transistor 1 and the current source 2 are sized such that below the critical temperature of the structural element, the current flowing through the bipolar transistor 1 is smaller than the current supplied by the current source 2. Consequently, the gate terminal G of the p-channel MOSFET 4 is negatively biased relative to the operating voltage $V_{DD}$ and the MOSFET 4 is conducting. The gate-source voltage of the MOSFET 4 is limited through the Zener diode 3, and the conducting MOSFET 4 draws a current whose level is determined by the ON state resistance 9 and the current supplied by the current source 5.

If the temperature of the semiconductor structural element, and hence of the bipolar transistor 1 increases, then the current through the bipolar transistor increases. If, upon reaching the critical temperature, the current through the bipolar transistor 1 becomes greater than the current through the current source 2, the current source 2 effectively has a step increase in resistance. This step increase causes the potential at the emitter of the bipolar transistor 1 increase and causes the potential at the gate terminal of the MOSFET 4 to increase to a value which is near the operating voltage. Accordingly, the MOSFET 4 is switched off and the voltage at the output terminal 8 assumes a value near ground potential. This signal can be detected as an excess temperature signal.

The zero-signal current of this circuit configuration is composed of the current flowing through the bipolar transistor 1 and that flowing through MOSFET 4. Normally, this current can be in the range of 10 uA, and this current level is undesirable for many application. For example, this current level is undesirable in the motor vehicle field.

SUMMARY OF THE INVENTION

An object of the present invention is to provide an improved temperature monitoring circuit configuration which reduces the zero-signal current of the circuit.

Accordingly, there is provided an improved circuit for monitoring the temperature of a semiconductor structural element and providing a signal when the temperature exceeds a preset limit, the circuit includes a bipolar transistor connected thermally to the semiconductor structural element, and a first current source connected in series to the bipolar transistor. The improvement comprises a MOSFET, wherein the source of the mosfet is coupled to the emitter of the bipolar transistor and the drain of the MOSFET is coupled to the current source; a Zener diode for maintaining the gate of the MOSFET at a first potential; and a second Zener diode for maintaining the source of the MOSFET at a second potential, the difference between the first potential and the second potential at the operating temperature of the semiconductor structural element being smaller that the threshold voltage of the MOSFET.

Various other objects and advantages will become apparent from the following description, with reference to the drawings.

DETAILED DESCRIPTION OF THE PREFERRED EMBODIMENTS

Figure 1:
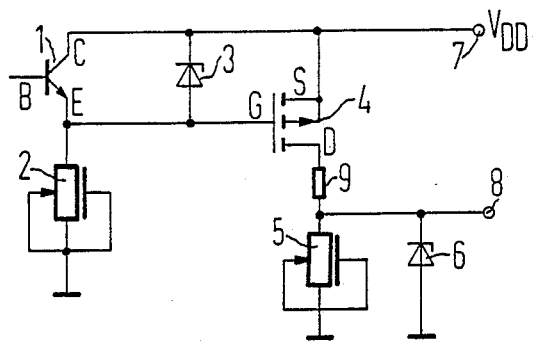
FIG. 1 illustrates a prior art circuit for monitoring the temperature of a semiconductor structural element.
Figure 2:
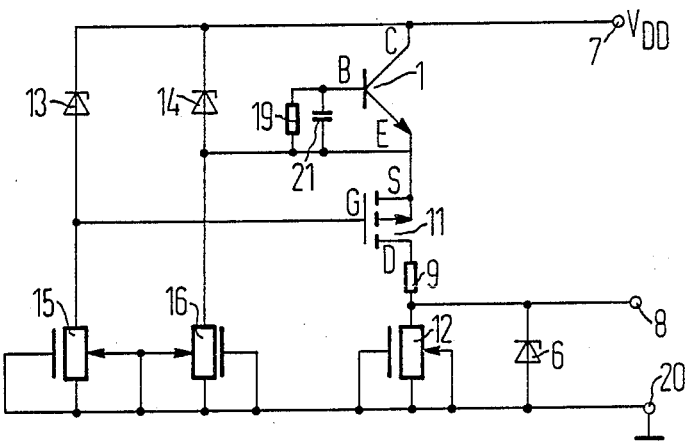
FIG. 2 illustrates a first embodiment of a temperature monitoring circuit.
Figure 3:
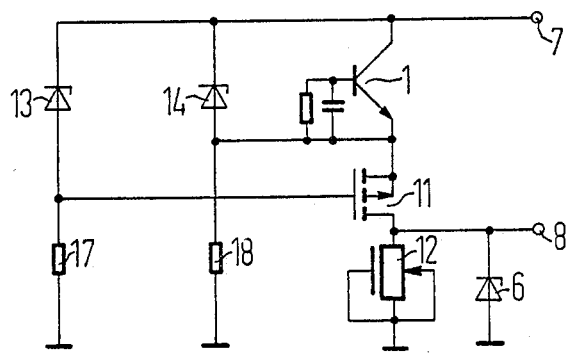
FIG. 3 illustrates a second embodiment of the temperature monitoring circuit.

Referring now to FIG. 2, a p-channel MOSFET 11, a resistance 9, and a current source 12 which are in series are coupled to the npn-bipolar transistor 1. The resistance 9 represents the ON state resistance of the MOSFET 11. The source terminal S of MOSFET 11 is connected with the emitter terminal E of the bipolar transistor 1. The collector terminal C is coupled to the terminal 7 which is at the operating voltage $V_{DD}$. A Zener diode 13 maintains the gate terminal G of MOSFET 11 at a first fixed potential. A Zener diode 14 is also used to maintain the source terminal S of the MOSFET 11 and the emitter terminal E of the bipolar transistor 1 at a second fixed potential. One current source 15, 16 is connected in series with one of the Zener diodes 13, 14 at their anodes, and both of these series circuits are at the operating voltage $V_{DD}$. The Zener voltages are identical to each other.

At a standard temperature a small current flows through the bipolar transistor 1. The emitter E potential and the source S potential of the MOSFET 11 are determined by the Zener voltage of the Zener diode 14. The gate G potential of the MOSFET 11 is determined by the Zener voltage of the Zener diode 13. If both Zener voltages are identical the gate-source voltage of MOSFET 11 is equal to zero and the latter is non-conducting. Accordingly, the potential at output 8 is substantially at ground potential.

If the bipolar transistor 1 is heated up, its current, its emitter E potential, and the source S potential of the MOSFET 11 increase toward the supply voltage $V_{DD}$ while the gate potential is kept constant through the Zener diode 13. If the gate-source voltage $V_{GS}$ reaches the MOSFET 11 threshold voltage the MOSFET 11 becomes conducting. Thus, a current can flow from the terminal 7 to ground. The magnitude of the current is determined by the level control of the bipolar transistor 1 and by the resistance 9. If this current becomes equal to the current supplied by the current source 12, the voltage at the current source 12 and between the output terminals 8 and 20 undergoes a step increase. This voltage step provides a signal which can be detected as an excess temperature signal.

The current sources 15 and 16 can be so dimensioned that the zero signal current through the bipolar transistor 1 and the off-state currents through the Zener diodes 13 and 14 are below 1 uA.

A resistor 19 can be connected between the base terminal B and its emitter terminal E of the bipolar transistor 1, and through appropriate dimensioning of this resistor 19 the switching temperature of the configuration can be adjusted in accurately-known values. In addition a capacitor 21 can be connected in parallel with the resistor 19 to reduce or eliminate the adverse effects of the interference voltages stemming from the supply voltage source.

In FIG. 2 the Zener current is limited by the current sources 15 and 16. In the second embodiment of the circuit, the current sources 15, 16 are replaced by resistors 17, 18. These resistors 17, 18 are dimensioned such that the Zener current which can be kept very small, and apart from the current flowing through the cold bipolar transistor 1, represents the zero signal current of the configuration.

While two embodiments of a temperature monitoring circuit have been shown and described in detail herein, various other changes and modifications may be made to these embodiments. For example, the Zener diodes can be at potentials different from $V_{DD}$, and their Zener voltages are then selected so that $V_{GS}$ in the cold state is smaller than the threshold voltage. The circuit can also be used with a negative supply voltage. In this configuration, the transitors are replaced with inverted conducting type transistors.

We claim:

1. A circuit for monitoring the temperature of a semiconductor structural element and providing a signal when the temperature exceeds a preset limit, the circuit includes a bipolar transistor connected thermally to the semiconductor structural element, and a first current source connected in series to the bipolar transistor, the improvement comprising:
    a MOSFET, wherein the source of the mosfet is coupled to the emitter of the bipolar transistor and the drain of the MOSFET is coupled to the current source;
    a Zener diode for maintaining the gate of the MOSFET at a first potential; and
    a second Zener diode for maintaining the source of the MOSFET at a second potential, the difference between the first potential and the second potential at the operating temperature of the semiconductor structural element being smaller that the threshold voltage of the MOSFET.

2. The circuit of claim 1, further comprising:
    a first resistor coupled in series with and to the anode of the first Zener diode; and
    a second resistor coupled in series with and to the anode of the second Zener diode.

3. The circuit of claim 1, further comprising:
    a second current source coupled in series with and to the anode of the first Zener diode; and
    a third current source coupled in series with and to the anode of the second Zener diode.

4. The circuit of claim 1, wherein the cathodes of the Zener diodes are coupled to the collector of the bipolar transistor and the Zener voltages are the same.

5. The circuit of claim 1, 2, 3, or 4, wherein a resistor is coupled to the base and emitter of the bipolar transistor.

6. The circuit of claim 1, 2, 3, or 4, wherein a capacitor is coupled to the base and emitter of the bipolar transistor.

* * * * *

UNITED STATES PATENT AND TRADEMARK OFFICE
CERTIFICATE OF CORRECTION

PATENT NO. : 4,875,131

DATED : Oct. 17, 1989

INVENTOR(S) : Leipold et al.

It is certified that error appears in the above-identified patent and that said Letters Patent is hereby corrected as shown below:

Cover Page

Section [30] delete "Aug. 11, 1988" and insert in its place --May 11, 1988--

Signed and Sealed this

Eighteenth Day of September, 1990

Attest:

HARRY F. MANBECK, JR.

*Attesting Officer*  *Commissioner of Patents and Trademarks*